(12) United States Patent
Kang et al.

(10) Patent No.: US 7,432,173 B2
(45) Date of Patent: Oct. 7, 2008

(54) METHODS OF FABRICATING SILICON-ON-INSULATOR SUBSTRATES HAVING A LASER-FORMED SINGLE CRYSTALLINE FILM

(75) Inventors: Sungkwan Kang, Gyeonggi-do (KR); Yong-Hoon Son, Gyeonggi-do (KR); Jongwook Lee, Gyeonggi-do (KR); Yugyun Shin, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/716,894

(22) Filed: Mar. 12, 2007

(65) Prior Publication Data

US 2007/0224789 A1    Sep. 27, 2007

(30) Foreign Application Priority Data

Mar. 22, 2006    (KR) ................ 10-2006-0026036

(51) Int. Cl.
*H01L 21/76* (2006.01)

(52) U.S. Cl. .............. 438/430; 438/403; 438/412; 438/486; 438/660; 257/E27.112; 257/E21.32; 257/E21.545; 257/E21.562

(58) Field of Classification Search ............... 438/403, 438/412, 660, 486; 257/E27.112, E21.32, 257/E21.545, E21.562

See application file for complete search history.

(56) References Cited

U.S. PATENT DOCUMENTS

| 6,930,357 B2 | 8/2005 | Kang |
| 7,312,473 B2* | 12/2007 | Koyama et al. ............... 257/88 |
| 2003/0141505 A1* | 7/2003 | Isobe et al. .................. 257/66 |
| 2003/0218170 A1* | 11/2003 | Yamazaki et al. ............ 257/59 |
| 2004/0253759 A1* | 12/2004 | Garber et al. ................ 438/46 |

FOREIGN PATENT DOCUMENTS

JP    2005-136100    5/2005

* cited by examiner

*Primary Examiner*—Michelle Estrada
(74) *Attorney, Agent, or Firm*—Myers Bigel Sibley & Sajovec, P.A.

(57) ABSTRACT

In some methods of fabricating a silicon-on-insulator substrate, a semiconductor substrate is provided that includes a single crystalline structure within at least a defined region thereof. A first insulating film is formed on the defined region of the semiconductor substrate with an opening that exposes a portion of the defined region of the semiconductor substrate having the single crystalline structure. A first non-single crystalline film is formed on the exposed portion of the semiconductor substrate and that at least substantially fills the opening in the first insulating film. A laser beam is generated that heats the first non-single crystalline film to change the first non-single crystalline film into a first single crystalline film having substantially the same single crystalline structure as the defined region of the semiconductor substrate.

33 Claims, 7 Drawing Sheets

METHODS OF FABRICATING SILICON-ON-INSULATOR SUBSTRATES HAVING A LASER-FORMED SINGLE CRYSTALLINE FILM

CROSS-REFERENCE TO RELATED APPLICATION

This application claims priority under 35 U.S.C. §119 to Korean Patent Application No. 10-2006-26036, filed on Mar. 22, 2006, the disclosure of which is hereby incorporated herein by reference in its entirety.

FIELD OF THE INVENTION

The present invention relates to methods of fabricating semiconductor devices, and more particularly, to methods of fabricating silicon-on-insulator substrates and related semiconductor devices.

BACKGROUND

Some semiconductor devices, such as some metal on silicon (MOS) transistors in memory devices, are fabricated using silicon-on-insulator (SOI) substrates. SOI substrates can improve operational characteristics of some semiconductor devices, such as by reducing parasitic capacitance and/or other undesirable conditions in those devices. The structure of a SOI substrate can include a silicon film that is insulated from a bulk semiconductor substrate by an insulating film therebetween.

In a transistor device that is formed on the insulated silicon film of a SOI substrate, electron ionization in the insulated silicon film near the transistor's drain may cause holes to accumulate. Accumulation of holes may decrease the potential barrier of the transistor's source and may result in a decrease in the threshold voltage of the transistor (floating body effect) and an increase in drain current (kink effect).

As integration densities of semiconductor devices using SOI substrates continue to increase, the accumulation of holes in the SOI substrates may have more undesirable effects on the operation of the associated devices.

SUMMARY

Some embodiments of the present invention are directed to methods of fabricating a silicon-on-insulator substrate. A semiconductor substrate is provided that includes a single crystalline structure within at least a defined region thereof. A first insulating film is formed on the defined region of the semiconductor substrate with an opening that exposes a portion of the defined region of the semiconductor substrate having the single crystalline structure. A first non-single crystalline film is formed on the exposed portion of the semiconductor substrate and that at least substantially fills the opening in the first insulating film. A laser beam is generated that heats the first non-single crystalline film to change the first non-single crystalline film into a first single crystalline film having substantially the same single crystalline structure as the defined region of the semiconductor substrate.

In some further embodiments, a second insulating film may be formed on the first insulating film. A portion of the second insulating film may be removed to form an opening that exposes a portion of the first insulating film. Before the first non-single crystalline film is formed, a portion of the first insulating film may be removed through the opening in the second insulating film to form the opening in the first insulating film that exposes the portion of the defined region of the semiconductor substrate having the single crystalline structure. The first non-single crystalline film may be formed on the exposed portion of the semiconductor substrate and fill the opening in the first insulating film and at least partially fill the opening in the second insulating film. The laser beam heats the first non-single crystalline film to change the first non-single crystalline film into the first single crystalline film having substantially the same single crystalline structure as the defined region of the semiconductor substrate in at least a major region of the first non-single crystalline film that is adjacent to the opening in the first insulating film.

In some further embodiments, a second insulating film is formed on the first insulating film. A second non-single crystalline film is formed on the exposed first single crystalline film and at least partially fills the opening in the second insulating film. A second laser beam is generated that heats the second non-single crystalline film to change the second non-single crystalline film into a second single crystalline film having substantially the same single crystalline structure as the first single crystalline film in at least a major region of the second non-single crystalline film adjacent to the opening in the first insulating film.

In some further embodiments, the first insulating layer pattern is formed with a plurality of spaced apart openings that expose portions of the defined region of the semiconductor substrate. The first single crystalline film is formed in the plurality of openings in the first insulating film pattern, and the first single crystalline film forms a first single crystalline film pattern. A second insulating film pattern is formed on the first insulating film pattern with a plurality of spaced apart openings each of which exposes a plurality of the first single crystalline film patterns in the plurality of openings in the first insulating film pattern. A second non-single crystalline film is formed on the exposed plurality of the first single crystalline film pattern and at least partially fills the plurality of openings in the second insulating film. A second laser beam is generated to heat the second non-single crystalline film and change it into a second single crystalline film having substantially the same single crystalline structure as the first single crystalline film pattern.

A first mask is formed to cover the second single crystalline film pattern in first ones of the plurality of openings in the second insulating film while leaving exposed the second single crystalline film in second ones of the plurality of openings in the second insulating film. First conductivity type impurities are doped into the second single crystalline film in the second ones of the plurality of openings in the second insulating film while using the mask to block dopants from entering the second single crystalline film in the first ones of the plurality of openings in the second insulating film. The first mask is removed. A second mask is formed that covers the second single crystalline film pattern in the second ones of the plurality of openings in the second insulating film while leaving exposed the second single crystalline film in the first ones of the plurality of openings in the second insulating film. Second conductivity type impurities, which are opposite to the first conductive type impurities, are doped into the second single crystalline film in the first ones of the plurality of openings in the second insulating film while using the mask to block dopants from entering the second single crystalline film in the second ones of the plurality of openings in the second insulating film. The second mask is removed.

A third insulating film pattern is formed on the second insulating film pattern with a plurality of spaced apart openings exposing portions of the second single crystalline film pattern. A third non-single crystalline film is formed on the exposed portions of the second single crystalline film pattern and filling the plurality of openings in the second insulating film. A third laser beam is generated to heat the third non-single crystalline film and change the third non-single crystalline film in the plurality of openings in the third insulating film into a third single crystalline film having substantially the same single crystalline structure as the second single crystalline film pattern. A fourth insulating film pattern is formed on the third insulating film pattern with a plurality of spaced apart openings each of which exposes a plurality of the third single crystalline film in the plurality of openings in the third insulating film pattern. A fourth laser beam is generated to heat the fourth non-single crystalline film and change the force non-single crystalline film in the plurality of openings in the fourth insulating film into a force single crystalline film having substantially the same single crystalline structure as the third single crystalline film pattern.

In some further embodiments, the first insulating film is formed with a plurality of spaced apart openings that expose portions of the defined region of the semiconductor substrate having the single crystalline structure. The first non-single crystalline film is formed on the lower insulating film and exposed portions of the semiconductor substrate through the plurality of openings in the first insulating film. The laser beam heats the first non-single crystalline film to change the first non-single crystalline film into the first single crystalline film in at least a major region of the first non-single crystalline film adjacent to the plurality of openings in the first insulating film.

In some further embodiments, an upper surface of the first single crystalline film is planarized to make it substantially aligned with an upper surface of the first insulating film. A second insulating film is formed on the first insulating film with an opening that exposes the first single crystalline film in the plurality of openings in the first insulating film. A second non-single crystalline film is formed on the exposed first single crystalline film and filling the opening in the second insulating film. A second laser beam is generated that heats and changes the second non-single crystalline film into a second single crystalline film having substantially the same single crystalline structure as the first single crystalline film. An upper surface of the second single crystalline film is planarized to make it substantially aligned with an upper surface of the second insulating film.

A third insulating film is formed on the second insulating film with a plurality of spaced apart openings that expose portions of the second single crystalline film. A third non-single crystalline film is formed on the exposed second single crystalline film in the plurality of openings in the third insulating film. A third laser beam is generated that heats and changes the third non-single crystalline film into a third single crystalline film having substantially the same single crystalline structure as the second single crystalline film. An upper surface of the third single crystalline film is planarized to make it substantially aligned with an upper surface of the third insulating film. A fourth insulating film is formed on the third insulating film with an opening that exposes the third single crystalline film in the plurality of openings in the third insulating film. A fourth non-single crystalline film is formed on the exposed third single crystalline film and that at least partially fills the opening in the fourth insulating film. A fourth laser beam is generated that heats and changes the fourth non-single crystalline film into a fourth single crystalline film having substantially the same single crystalline structure as the third single crystalline film.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF EMBODIMENTS OF THE INVENTION

Figure 1:
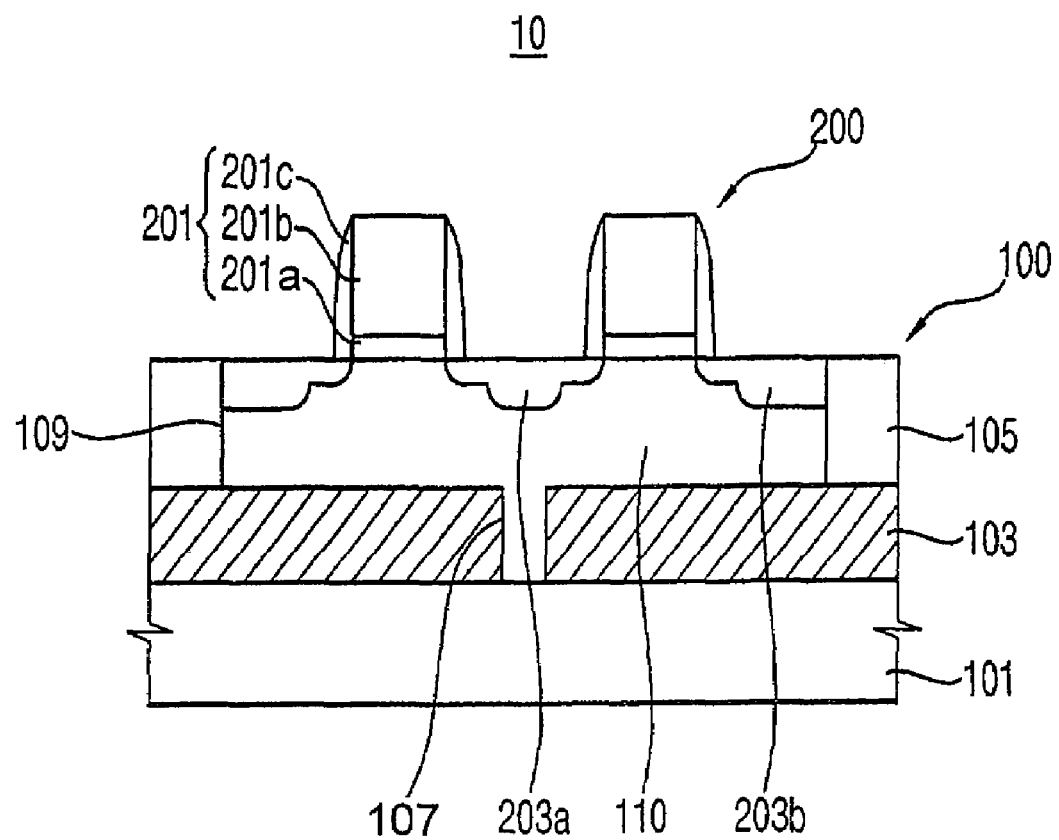
FIG. 1 is a cross-sectional view that illustrates a semiconductor device including a SOI substrate and illustrates associated methods of fabricating the same according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, film or region to another element, film or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of films and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

FIG. 1 is a cross-sectional view that illustrates a semiconductor device 10 that includes metal-on-silicon (MOS) transistor 200 that is formed on a SOI substrate 100, and illustrates associated methods of fabricating the same according to some embodiments of the present invention. Referring to FIG. 1, a semiconductor substrate 101 has a single crystalline structure within at least a defined region thereof, and may have the single crystalline structure throughout. A lower insulating film pattern 103 is on the defined region of the semiconductor substrate 101, and has a lower opening 107 that exposes a portion of the defined region of the semiconductor substrate 101 having the single crystalline structure. An upper insulating film pattern 105 is on the lower insulating film pattern 103 and has an upper opening 109 that exposes a portion of the lower insulating film pattern 103 including the lower opening 107 therein.

The upper insulating film pattern 105 may be formed from a material having a different etch selectivity relative to the lower insulating film pattern 103. The upper insulating film pattern 105 may include silicon nitride and the lower insulating film pattern 103 may include silicon oxide. Alternatively, the upper insulating film pattern 105 may include silicon oxide and the lower insulating film pattern 103 may include silicon nitride.

A single crystalline silicon pattern 110 fills the lower opening 107 in the lower insulating film pattern 103 and at least partially fills the upper opening 109 in the upper insulating film pattern 105. The single crystalline silicon pattern 110 is formed from a non-single crystalline silicon pattern that is heated by a laser beam to change the non-single crystalline silicon pattern into the single crystalline silicon pattern 110 having substantially the same single crystalline structure as the defined region of the semiconductor substrate 101. The non-single crystalline silicon pattern may include amorphous silicon and/or polycrystalline silicon. The laser beam is configured to melt the non-single crystalline silicon pattern substantially throughout, such as to a temperature that is sufficient to melt amorphous silicon and/or polycrystalline silicon (e.g., above about 1410 Centigrade). The single crystalline structure of the semiconductor substrate 101 acts as a seed film for the melted non-single crystalline silicon pattern to grow through the lower opening 107, via a selective epitaxial growth (SEG) process, and change lattice parameters of the non-single crystalline silicon pattern to form the single crystalline silicon-pattern 110, which can have the same crystalline structure substantially throughout.

The single crystalline silicon pattern 110 may be doped with impurities such as boron (B), phosphorus (P), and/or arsenic (As). The impurities may be doped by diffusion, ion implantation, and/or other fabrication processes.

The semiconductor device 10 includes device elements that are fabricated on the single crystalline silicon pattern 110 of the SOI substrate 100. For example, the MOS transistor 200 may include a gate pattern 201 on the single crystalline silicon pattern 110 with adjacent source region 203a and drain region 203b formed in the single crystalline selection pattern 110. The gate pattern 201 may include a gate insulating film pattern 201a and a gate conductive pattern 201b stacked on the single crystalline selection pattern 110, and gate spacers 201c on opposite side walls of the stacked structure.

The lower insulating film pattern 103 may have a thickness that is sufficient to function as a buried insulating film between the single crystalline silicon pattern and the semiconductor substrate 101, and may thereby substantially isolate the MOS transistor 200 from the semiconductor substrate 101. The upper insulating film pattern 105 may have a thickness that is sufficient to function as an element isolation film between, for example, the MOS transistor 200 and other adjacent devices that are formed on an opposite side of the upper insulating film pattern 105.

Figure 2A:
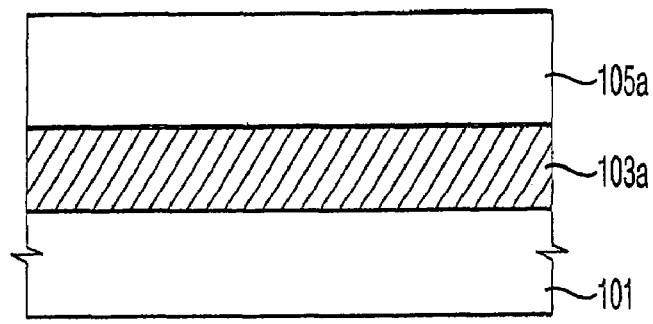
FIGS. 2a-f are cross-sectional views illustrating methods of fabricating SOI substrates and semiconductor devices that include SOI substrates in accordance with some embodiments of the present invention.

FIGS. 2a to 2f are cross-sectional views illustrating methods of fabricating SOI substrates and semiconductor devices that include SOI substrates in accordance with some embodiments of the present invention. Referring to FIG. 2a, a lower insulating film 103a is formed on the single crystalline semiconductor substrate 101, such as by a chemical vapor deposition (CVD) process. An upper insulating film 105a is formed on the lower insulating film 103a, such as by another CVD process. The upper insulating film 105a may have a different selectivity ratio (etching selectivity) relative to the lower insulating film 103a. For example, the lower insulating film 103a may be substantially formed from silicon nitride and the upper insulating film 105a may be substantially formed from silicon oxide.

Figure 2B:
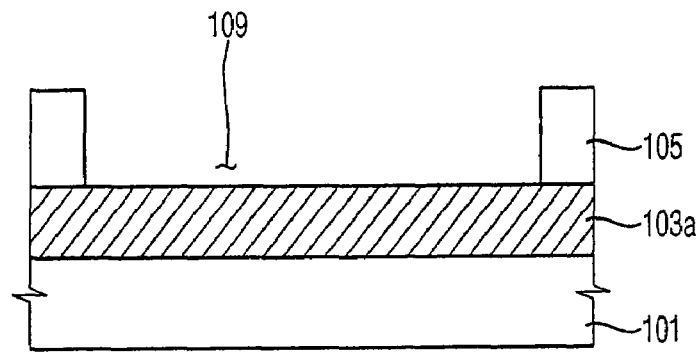

Referring to FIG. 2b, the upper insulating film 105a is patterned to form the upper insulating film pattern 105, and to define the upper opening 109 therein which exposes a portion of an upper surface of the lower insulating film 103a over the single crystalline semiconductor substrate 101. The upper insulating film 105a may be etched to form the upper opening 109 using the lower insulating film 103a as an etch stop.

Figure 2C:
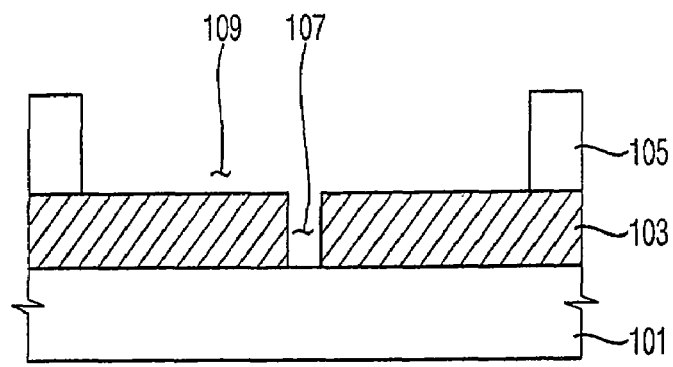

Referring to FIG. 2c, the lower insulating film 103a is patterned, through the upper opening 109 in the upper insulating film 105, to form the lower insulating film pattern 103, and to define the lower opening 107 therein that exposes a portion of an upper surface of the single crystalline semiconductor substrate 101. The lower insulating film 103a may be etched to form the lower opening 107 using a photo resist pattern or a hard mask as an etching mask.

Figure 2D:
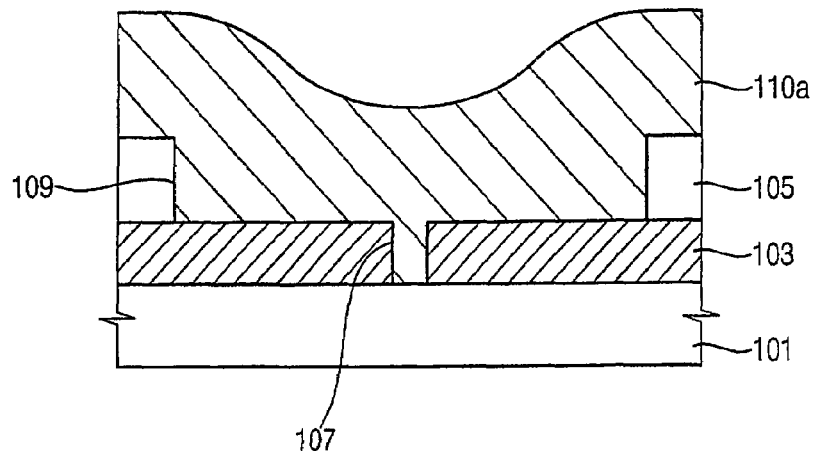

Referring to FIG. 2d, a non-single crystalline film 110a is formed that fills the lower opening 107 in the lower insulating film pattern 103 and the upper opening 109 in the upper insulating film pattern 105. The non-single crystalline film 110a may be formed, for example, by depositing amorphous silicon and/or polycrystalline silicon across the semiconductor substrate 101, such as through a CVD process using a a silicon source gas including silane ($SiH_4$) and/or hexadichlorosilane ($Si_2H_6$).

Impurities may be doped into the non-single crystalline film 110a, such as by supplying a phosphorus source gas (e.g., $PH_3$) to dope phosphorus into the non-single crystalline film 110a and/or by supplying a boron source gas (e.g., $B_2H_6$) to dope boron into the non-single crystalline film 110a in-situ while depositing the non-single crystalline film 110a. Alternatively, impurity ions, such as arsenic, may be implanted into the non-single crystalline film 110a.

Figure 2E:
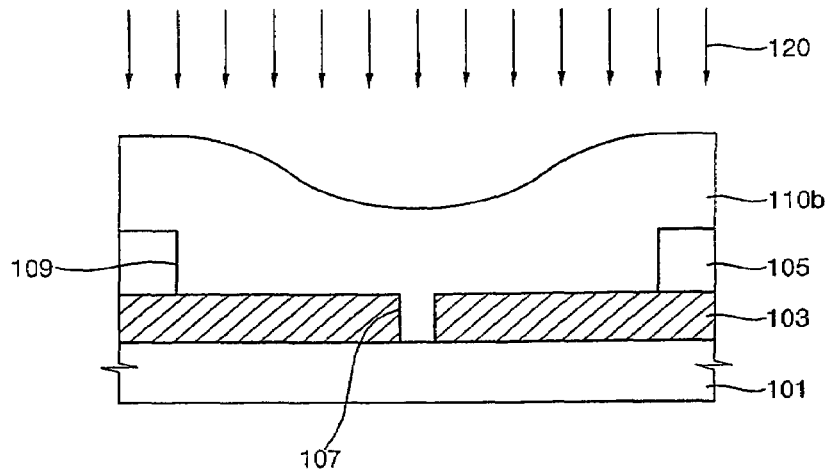

Referring to FIG. 2e, a laser beam 120 is generated that melts the non-single crystalline film 110a from its upper surface extending therethrough down to the single crystalline semiconductor substrate 101 via the lower opening in the lower insulating film pattern 103. The laser beam 120 therefore heats the non-single crystalline film 110a to above its melting point, which for amorphous silicon and polycrystalline silicon may be above about 1410 Centigrade.

The single crystalline structure of the semiconductor substrate 101 forms a seed film which causes the lattice parameters of the melted non-single crystalline film 110a to change so as to have substantially the same single crystalline structure as the semiconductor substrate 101 (e.g., via an epitaxial growth process), and thereby form a single crystalline silicon film 110b. The single crystalline silicon film 110b may have the same single crystalline structure throughout or at least across a major region thereof that is adjacent to the lower opening 107 in the lower insulating film pattern 103.

The laser beam 120 may be generated to heat the non-single crystalline film 110a for a time period of about 1 nanosecond to about 1000 nanoseconds or, more particularly, for a time period of between about 5 nanoseconds to about 200 nanoseconds, so that the non-single crystalline film 110a is in a melted state for a sufficiently brief time so as to not substantially flow across an upper surface of the lower insulating film pattern 103.

The laser beam 120 may be generated using a Nd Yttrium-Aluminum-Garnet (YAG) laser apparatus, a carbon laser apparatus, and/or an excimer laser apparatus. The laser beam 120 may be focused on an area corresponding to one or more of the upper openings 109 in the upper insulating film pattern 105, and may be scanned across the semiconductor substrate 101 while modulating the laser beam 120 on/off to sequentially heat selected portions of the non-single crystalline film 110a in the upper openings 109 in the upper insulating film pattern 105.

Before the non-single crystalline film 110a is heated with the laser beam 120, the semiconductor substrate 101 may be preheated (e.g., within a furnace). Preheating the semiconductor substrate 101 reduces a relatively large temperature gradient that may otherwise result when the non-single crystalline film 110a is rapidly heated by the laser beam 120 to sufficiently high temperatures to melt the non-single crystalline film 110a while the temperatures of the adjacent portions of the semiconductor substrate 101 are more slowly raised from their initial temperature. The semiconductor substrate 101 may, for example, be preheated to above about 100° C. and maintained at one or more temperatures above about 100° C. while the non-single crystalline film 110a is heated with the laser beam 120 so as to reduce the temperature gradient between the laser heated regions of the non-single crystalline film 110a and the semiconductor substrate 101.

Figure 2F:
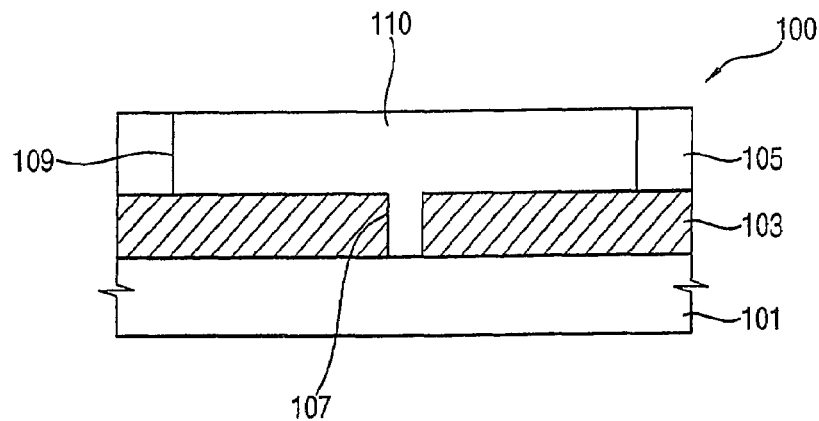

Referring to FIG. 2f, an upper surface of the single crystalline silicon film 110b is planarized, such as by a chemical mechanical polishing (CMP) process, to form a single crystalline silicon pattern 110 having an upper surface that is substantially aligned (planar) with an upper surface of the upper insulating film pattern 105.

A plurality of gate patterns 201 may then be formed on the single crystalline silicon pattern 110, such as those shown in FIG. 1. Impurities may be doped into the single crystalline silicon pattern 110 to form a source region 203a and a drain region 203b therein, such as those shown in FIG. 1. Because the single crystalline silicon pattern 110 has the same crystalline lattice structure as the semiconductor substrate 101, defects may be at least substantially avoided at the interface between the single crystalline silicon pattern 110 and the semiconductor substrate 101. The single crystalline lattice structure of the silicon pattern 110 may reduce or prevent accumulation of holes and associated undesirable effects during the operation of a MOS transistor 200 formed thereon (e.g., avoid decreased potential barrier, decreased threshold voltage, and/or increased drain current in the MOS transistor 200).

Figure 3A:
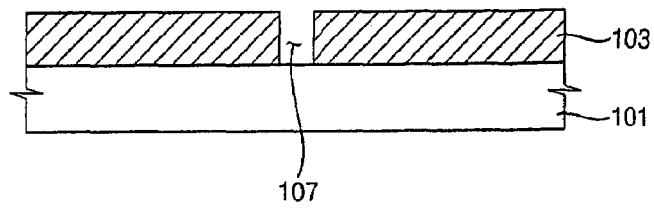
FIGS. 3a-f are cross-sectional views illustrating methods of fabricating SOI substrates and semiconductor devices that include SOI substrates in accordance with some other embodiments of the present invention.

FIGS. 3a to 3f are cross-sectional views illustrating methods of fabricating SOI substrates and semiconductor devices that include SOI substrates in accordance with some other embodiments of the present invention. Referring to FIG. 3a, a lower insulating film is formed on the single crystalline semiconductor substrate 101, such as by a chemical vapor deposition (CVD) process, and is patterned to form the lower insulating film pattern 103. The lower insulating film may be patterned by a photo etch process using a photo resist pattern as an etching mask. The lower insulating film pattern 103 defines a lower opening 107 that exposes a portion of the single crystalline semiconductor substrate 101.

Figure 3B:
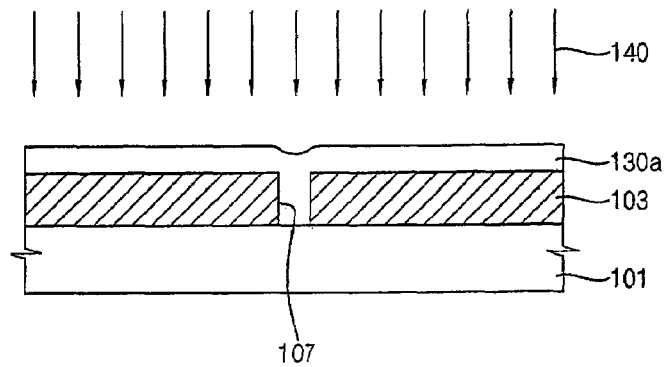

Referring to FIG. 3b, a non-single crystalline silicon film 130a is formed on the lower insulating film pattern 103 and at least partially fills the lower opening 107 or, as shown in FIG. 3b, entirely fills the lower opening 107. The non-single crystalline silicon film 130a may be deposited as amorphous silicon and/or polycrystalline silicon using a CVD process, and may be doped with impurities such as using the processes described above with regard to FIG. 2d. A laser beam 140 is generated that melts the non-single crystalline silicon film 130a. The single crystalline lattice structure of the semiconductor substrate 101 acts as a seed film on which the melted non-single crystalline silicon film 130a grows the same single crystalline lattice structure to form a single crystalline silicon film.

Before the non-single crystalline silicon film 130a is heated with the laser beam 120, the semiconductor substrate 101 may be preheated (e.g., within a furnace), such as to above about 100° C. and maintained at one or more temperatures above about 100° C. while the non-single crystalline silicon film 130a is heated with the laser beam 140.

Figure 3C:
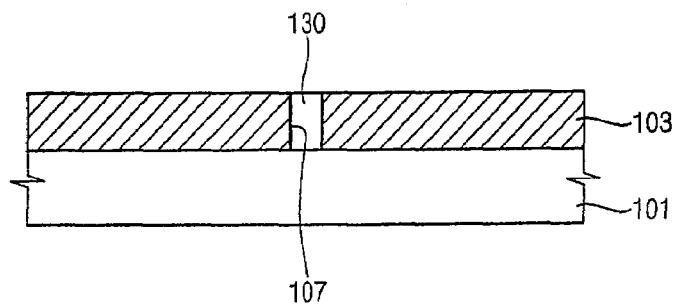

Referring to FIG. 3c, an upper surface of the single crystalline silicon film is planarized, such as by a chemical mechanical polishing (CMP) process, to form a lower single crystalline silicon pattern 130 (e.g., having a plug structure) having an upper surface that is substantially aligned (planar) with an upper surface of the lower insulating film pattern 103.

Alternatively, before heating with the laser beam 140, the non-single crystalline silicon film 130a shown in FIG. 3b may be planarized to form a non-single crystalline silicon plug 130. The non-single crystalline silicon plug 130 may then be melted with the laser beam 140 to grow throughout substantially the same single crystalline structure as the semiconductor substrate 101.

Figure 3D:
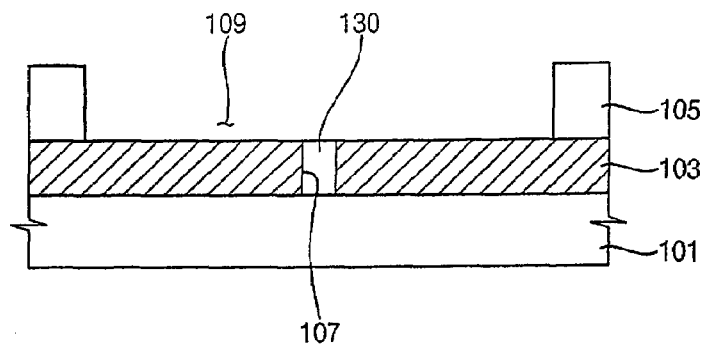

Referring to FIG. 3d, an upper insulating film pattern 105 is formed on the lower insulating film pattern 103, such as by depositing an upper insulating film (e.g., by a CVD process) and etching the upper insulating film to form the upper insulating film pattern 105, and to define the upper opening 109 therein which exposes a portion of the lower insulating film pattern 103 and the single crystalline film 130.

Figure 3E:
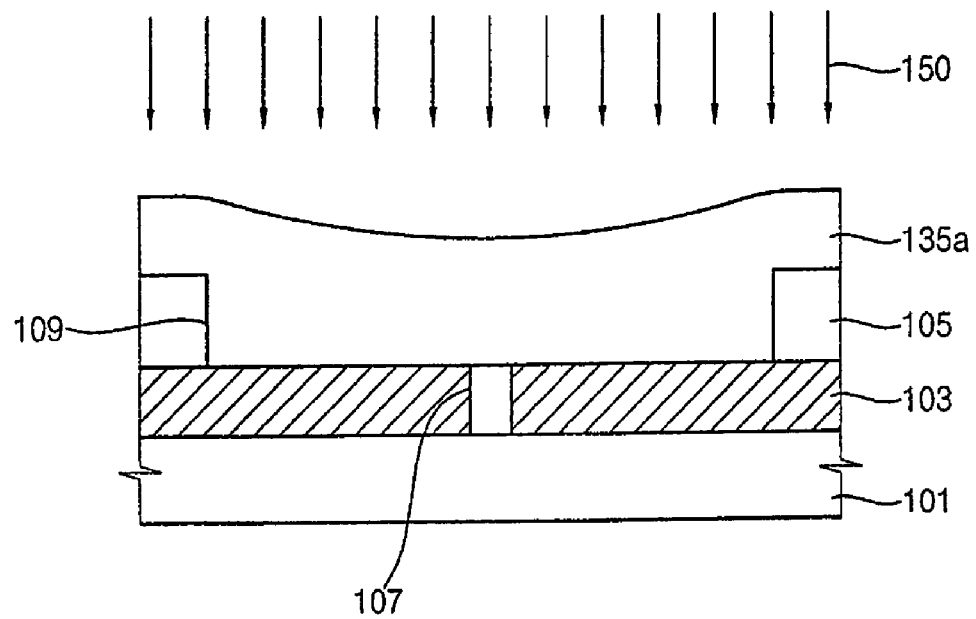

Referring to FIG. 3e, a second non-single crystalline silicon film 135a is formed on the lower insulating film pattern 103 and at least partially fills the upper opening 109 or, as shown in FIG. 3e, entirely fills the upper opening 109. The second non-single crystalline silicon film 135a may be deposited as amorphous silicon and/or polycrystalline silicon using a CVD process, and may be doped with impurities such as using the processes described above with regard to FIG. 2d.

A laser beam 150 is generated that melts the second non-single crystalline silicon film 135a from an upper surface thereof down to a lower surface contacting the single crystalline silicon pattern 130. The single crystalline lattice structure of the single crystalline silicon pattern 130 acts as a seed film on which the melted second non-single crystalline silicon film 135a grows the same single crystalline lattice structure to form a second single crystalline silicon film. The laser beam 150 may be controlled to heat the second non-single crystalline silicon film 135a in the manner described above with regard to FIG. 2e.

Figure 3F:
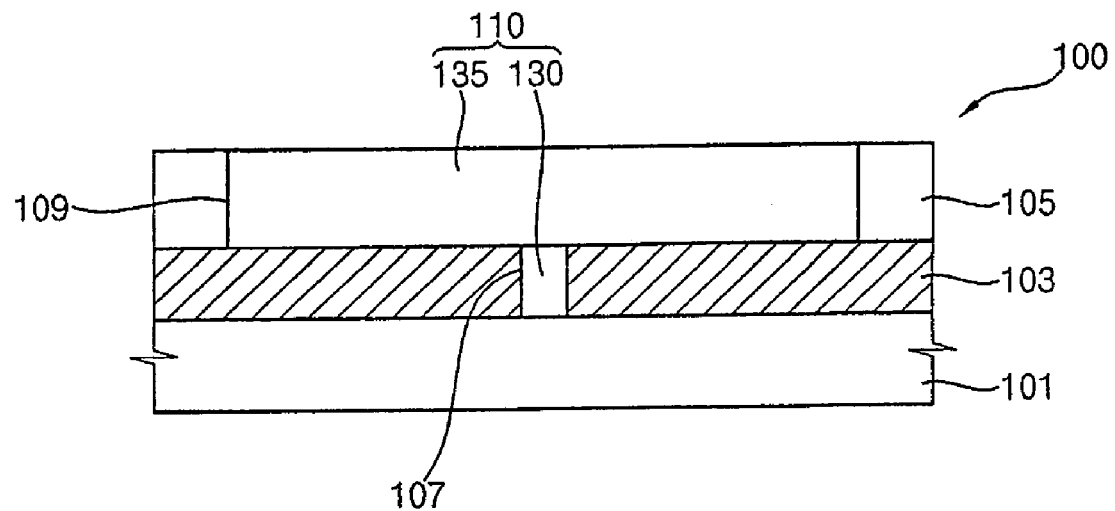

Referring to FIG. 3f, an upper surface of the second single crystalline silicon film 135a is planarized, such as by a CMP process, to form an upper single crystalline silicon pattern 135 having an upper surface that is substantially aligned with an upper surface of the upper insulating film pattern 105. Accordingly, the lower single crystalline film 130 and the upper single crystalline silicon pattern 135 form a stacked single crystalline silicon pattern 110.

Alternatively, with reference to FIGS. 3e and 3f, before generating the laser beam 150, the second non-single crystalline silicon film 135a may be planarized to form a second non-single crystalline silicon pattern as shown in FIG. 3f. The second non-single crystalline silicon pattern can then be melted using the laser beam 150 to change the second non-single crystalline silicon pattern into a single crystalline silicon pattern.

A plurality of gate patterns 201 may then be formed on the stacked single crystalline silicon pattern 110, such as those shown in FIG. 1. Impurities may be doped into the stacked single crystalline silicon pattern 110 to form a source region 203a and a drain region 203b therein, such as those shown in FIG. 1. The single crystalline lattice structure of the silicon pattern 110 may reduce or prevent the accumulation of holes and associated undesirable effects during the operation of the MOS transistor 200 formed therein.

Figure 4A:
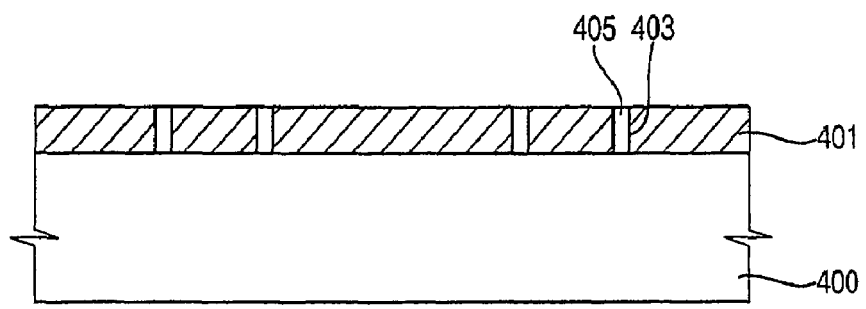
FIGS. 4a-f are cross-sectional views illustrating methods of fabricating SOI substrates and semiconductor devices that include SOI substrates in accordance with yet some other embodiments of the present invention.

FIGS. 4a to 4f are cross-sectional views illustrating methods of fabricating SOI substrates and semiconductor devices that include SOI substrates in accordance with yet some other embodiments of the present invention. Referring to FIG. 4a, a first insulating film is formed on a single crystalline semiconductor substrate 400, such as by a chemical vapor deposition (CVD) process, and is patterned to form a first insulating film pattern 401 with a plurality of spaced apart openings 403 exposing portions of the semiconductor substrate 400. The first insulating film may be patterned by a photo etch process using a photo resist pattern as an etching mask.

A first single crystalline silicon pattern 405 is formed in the plurality of spaced apart openings 403 in the first insulating film pattern 401. The first single crystalline silicon pattern 405 may be formed from a first non-single crystalline silicon film deposited as amorphous silicon and/or polycrystalline silicon using a CVD process, and may be doped with impurities such as using the processes described above with regard to FIG. 2d. A laser beam may be used to melt the first non-single crystalline silicon film and convert it to the first single crystalline silicon pattern 405 having substantially the same crystalline structure as the single crystalline semiconductor substrate 101, and may be planarized as shown in FIG. 4a.

Figure 4B:
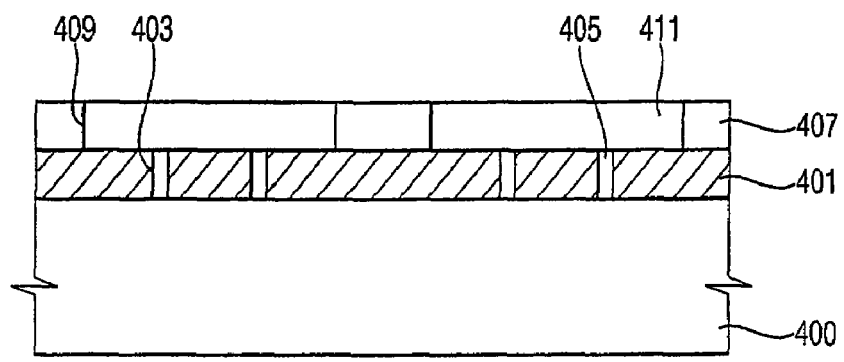

Referring to FIG. 4b, a second insulating film pattern 407 is formed on the first insulating film pattern 401 and defines a plurality of openings 409, each of which exposes a portion of an upper surface of the first insulating film pattern 401 and a plurality of the openings 403 in the first insulating film pattern 401. A second single crystalline silicon pattern 411 is formed in the plurality of openings 409, and may be formed in a similar manner to the processes described above with regard to FIGS. 2d-f to form the single crystalline silicon pattern 110. Because each of the openings 409 in the second insulating film pattern 407 expose a plurality of the first single crystalline silicon patterns 405 (i.e., a plurality of the first single crystalline silicon plugs), a larger cumulative single crystalline seed area is provided on which to grow the second single crystalline silicon pattern 411.

Figure 4C:
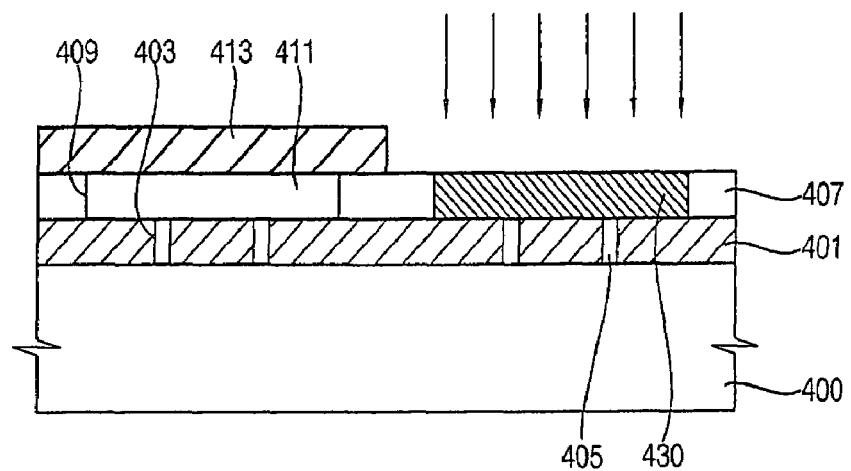

Referring to FIG. 4c, a first ion mask 413 (e.g., a photoresist pattern) is formed to cover at least a first one(s) of the second single crystalline silicon patterns 411 while leaving exposed at least a second one(s) of the second single crystalline silicon patterns 411. First conductivity type impurities are implanted into the exposed second one(s) of the second single crystalline silicon patterns 411 and form a first conductivity type well 430, while using the first ion mask 413 to block impurities from entering the covered first one(s) of the second single crystalline silicon patterns 411.

Figure 4D:
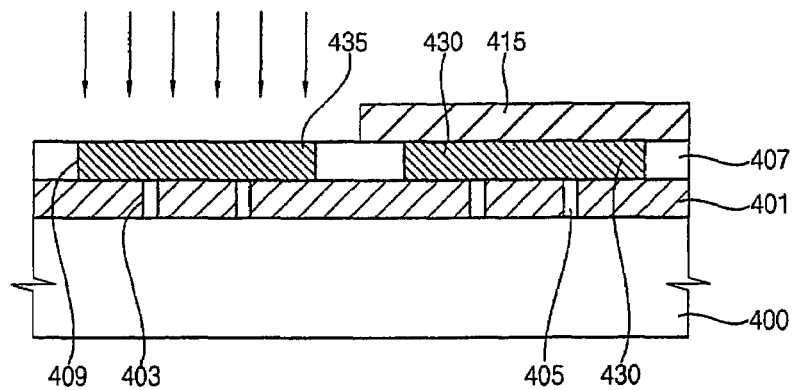

Referring to FIG. 4d, the first ion mask 413 is removed and a second ion mask 415 (e.g., a photoresist pattern) is formed to cover at least the second one(s) of the second single crystalline silicon patterns 411 while leaving exposed at least the first one(s) of the second single crystalline silicon patterns 411. Second conductivity type impurities, which are opposite to the first conductivity type impurities, are implanted into the exposed first one(s) of the second single crystalline silicon patterns 411 to form a second conductivity type well 435, while using the second ion mask 415 to block impurities from entering the covered second one(s) of the second single crystalline silicon patterns 411.

The first conductivity type impurities may be one of n-type/p-type impurities and the second conductivity type impurities may be a different one of p-type/n-type impurities from the first conductivity type impurities. Accordingly, the first one(s) of the second single crystalline silicon patterns 411 may be doped with n-type impurities to become an n-type single crystalline silicon well(s) for forming N-MOS transistors, and the second one(s) of the second single crystalline silicon patterns for 11 may be doped with p-type impurities to become p-type single crystalline silicon well(s) for forming P-MOS transistors.

Figure 4E:
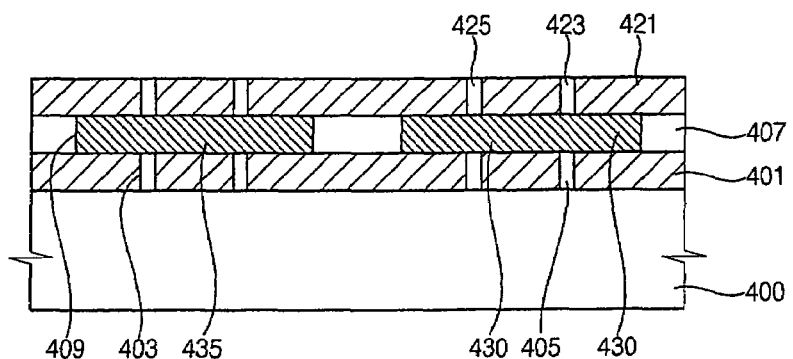

Referring to FIG. 4e, the second ion mask 415 is removed. A third insulating film pattern 421 is formed with a plurality of openings 423 defined therein. Portions of the each of the wells 430 and 435 are exposed by the plurality of openings 423 in the third insulating film pattern 421. A third single crystalline silicon pattern 425 is formed in the plurality of openings 423 in the third insulating film pattern 421. The third single crystalline silicon pattern 425 may be formed in a similar manner to the first single crystalline silicon pattern 405 described above with regard to FIG. 4a.

Figure 4F:
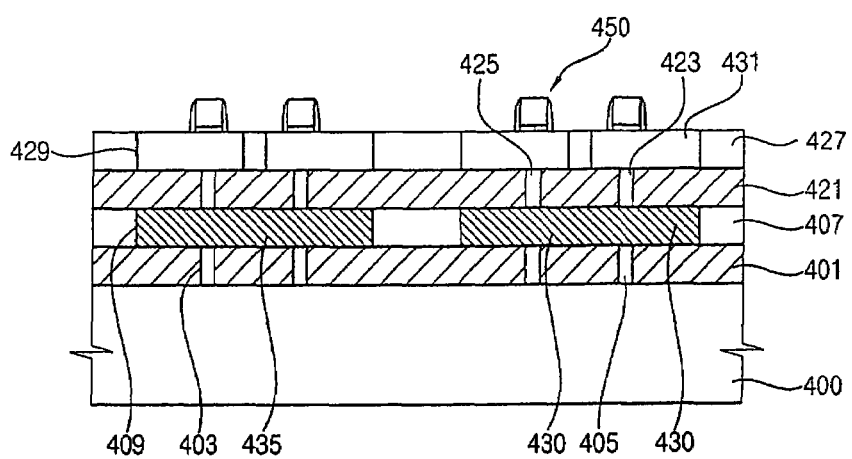

Referring to FIG. 4f, a fourth insulating film pattern 427 is formed on the third insulating film pattern 421, and has a plurality of openings 429 each of which exposes at least one of the third single crystalline silicon patterns 425. A fourth single crystalline silicon pattern 431 is formed in the openings 429 in the fourth insulating film pattern 427, and may be formed using a similar process to that described above with regard to the second single crystalline silicon pattern 411 of FIG. 4b. A plurality of gate patterns 450 are formed on the fourth single crystalline silicon pattern 431, and each of the gate patterns 450 may be formed on a different one of the fourth single crystalline silicon patterns 431. Impurities may be doped into selected areas of the fourth single crystalline silicon pattern 431 to form source regions and drain regions adjacent to respective ones of the gate patterns 450 and may, thereby, form a plurality of MOS transistors. Accordingly, channel regions of the MOS transistors may be formed in the fourth single crystalline silicon pattern 431, and the fourth insulating film pattern 427 may form element isolation films between adjacent MOS transistors and/or relative to other adjacent devices.

As shown in FIGS. 4a-f, the plurality of openings 403 and 423 through the first and third insulating film patterns 401 and 421 provide a larger cumulative single crystalline seed area on which to grow the second and fourth single crystalline silicon patterns 411 and 431. Moreover, growth of the single crystalline silicon structure from the single crystalline semiconductor substrate 101 through the first, second, third, and fourth single crystalline silicon patterns 405, 411, 425 and 431 may reduce or substantial avoid defects at the interfaces therebetween and associated undesirable effects thereof. The single crystalline lattice structure of the first, second, third, and fourth single crystalline silicon patterns 405, 411, 425 and 431 may reduce or prevent the occurrence of accumulation of holes and associated undesirable effects on the operation of the MOS transistor formed therein.

Instead of forming the first single crystalline silicon pattern 405 and second single crystalline silicon pattern 411 by separate deposition and separate laser heating processes, they may instead be formed together. For example, the first insulating film pattern 401 and the second insulating film pattern 407 may be sequentially formed, and a non-single crystalline silicon film may be deposited in the openings 403 and 409. A laser beam may then be used to melt the non-single crystalline silicon film and convert it into a single crystalline silicon film having the single crystalline structure of the semiconductor substrate 400, such as in the manner described above with regard to the insulating film patterns 103 and 105 and single crystalline silicon pattern 110 of FIGS. 2a to 2f. The third single crystalline silicon pattern 425 and the fourth single crystalline silicon pattern 431 may similarly be formed together.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of fabricating a silicon-on-insulator (SOI) substrate, the method comprising:
providing a semiconductor substrate having a single crystalline structure within at least a defined region thereof;
forming a first insulating film pattern on the defined region of the semiconductor substrate with an opening that exposes a portion of the defined region of the semiconductor substrate having the single crystalline structure;
forming a first non-single crystalline film on the exposed portion of the semiconductor substrate and that fills the opening in the first insulating film pattern; and
generating a laser beam that heats the first non-single crystalline film to change the first non-single crystalline film into a first single crystalline film having the same single crystalline structure as the defined region of the semiconductor substrate.

2. The method of fabricating the SOI substrate of claim 1, further comprising preheating the semiconductor substrate before generating the laser beam to reduce a temperature gradient between the laser heated first non-single crystalline film and the semiconductor substrate.

3. The method of fabricating the SOI substrate of claim 2, wherein preheating the semiconductor substrate before generating the laser beam comprises preheating the semiconductor substrate to above about 100° C. and maintaining the semiconductor substrate at one or more temperatures above about 100° C. while generating the laser beam to reduce a temperature gradient between the laser heated first non-single crystalline film and the semiconductor substrate.

4. The method of fabricating the SOI substrate of claim 1, wherein generating a laser beam comprises heating the first non-single crystalline film for a time period of between about 1 nanosecond to about 1,000 nanoseconds so that the first non-single crystalline film is in a melted state for a sufficiently brief time to not flow across an upper surface of the first insulating film pattern.

5. The method of fabricating the SOI substrate of claim 4, wherein generating a laser beam comprises heating the first non-single crystalline film for a time period of between about 5 nanoseconds to about 200 nanoseconds.

6. The method of fabricating the SOI substrate of claim 1, wherein generating a laser beam is carried out using a Nd Yttrium-Aluminum-Garnet (YAG) laser apparatus, a carbon laser apparatus, and/or an excimer laser apparatus.

7. The method of fabricating the SOI substrate of claim 1, further comprising:
forming a first insulating film on the semiconductor substrate;
forming a second insulating film on the first insulating film;
removing a portion of the second insulating film to form a second insulating film pattern with an opening exposing a portion of the first insulating film; and
before forming the first non-single crystalline film, removing a portion of the first insulating film through the opening in the second insulating film to form the first insulating film pattern with the opening that exposes the portion of the defined region of the semiconductor substrate having the single crystalline structure.

8. The method of fabricating the SOI substrate of claim 7, wherein:
forming a first non-single crystalline film comprises forming the first non-single crystalline film on the exposed portion of the semiconductor substrate and that fills the opening in the first insulating film pattern and at least partially fills the opening in the second insulating film pattern; and generating a laser beam comprises heating the first non-single crystalline film to change the first non-single crystalline film into the first single crystalline film having the same single crystalline structure as the defined region of the semiconductor substrate in at least a major region of the first non-single crystalline film adjacent to the opening in the first insulating film pattern.

9. The method of fabricating the SOI substrate of claim 8, wherein generating the laser beam comprises melting the first non-single crystalline film in at least the major region adjacent to the opening in the first insulating film pattern so that the first single crystalline structure of the semiconductor substrate forms a seed film which changes lattice parameters of the melted first non-single crystalline film to have the same single crystalline structure as the defined region of the semiconductor substrate.

10. The method of fabricating the SOI substrate of claim 8, wherein:
forming a first non-single crystalline film comprises depositing amorphous silicon and/or polycrystalline silicon on the exposed portion of the semiconductor substrate and filling the opening in the first insulating film pattern and at least partially filling the opening in the second insulating film pattern; and
generating a laser beam comprises heating the first non-single crystalline film in at least the major region adjacent to the opening in the first insulating film pattern to a temperature above a melting point of silicon.

11. The method of fabricating the SOI substrate of claim 8, wherein the first insulating film pattern is formed from a material having an etch selectivity that is different from an etch selectivity of the second insulating film pattern.

12. The method of fabricating the SOI substrate of claim 11, wherein:
forming the first insulating film comprises depositing one of a silicon nitride film and a silicon oxide film; and
forming the second insulating film comprising depositing a different one of the silicon nitride film and the silicon oxide film from the lower insulating film.

13. The method of fabricating the SOI substrate of claim 11, wherein removing a portion of the second insulating film comprises etching the second insulating film using the first insulating film as an etch stop.

14. The method of fabricating the SOI substrate of claim 13, wherein removing a portion of the first insulating film comprises etching the first insulating film using the second insulating film as an etching mask.

15. The method of fabricating the SOI substrate of claim 1, wherein the first insulating film pattern is formed having a thickness that is sufficient to function as a buried insulating film between the first single crystalline film and the semiconductor substrate.

16. The method of fabricating the SOI substrate of claim 15, wherein a second insulating film pattern is formed having a thickness that is sufficient to function as an element isolation film between a semiconductor device formed on the first single crystalline film and another adjacent semiconductor device formed on the semiconductor substrate on an opposite side of the second insulating film pattern.

17. The method of fabricating the SOI substrate of claim 1, wherein forming the first non-single crystalline film comprises depositing amorphous silicon and/or polycrystalline silicon on the exposed portion of the semiconductor substrate to fill the opening in the first insulating film pattern and at least partially fill an opening in a second insulating film pattern.

18. The method of fabricating the SOI substrate of claim 17, wherein the first non-single crystalline film is formed by chemical vapor deposition using a silicon source gas including silane ($SiH_4$) and/or hexadichlorosilane ($Si_2H_6$).

19. The method of fabricating the SOI substrate of claim 1, further comprising doping impurities into the first non-single crystalline film before generating the laser beam.

20. The method of fabricating the SOI substrate of claim 19, wherein doping impurities into the first non-single crystalline film before generating the laser beam comprises supplying a phosphorous source gas to dope phosphorous into the first non-single crystalline film and/or supplying a boron source gas to dope boron into the first non-single crystalline film.

21. The method of fabricating the SOI substrate of claim 19, wherein doping impurities into the first non-single crystalline film before generating the laser beam comprises implanting impurity ions into the first non-single crystalline film.

22. The method of fabricating the SOI substrate of claim 1, further comprising planarizing an upper surface of the first single crystalline film to form a first single crystalline film pattern having an upper surface that is aligned with an upper surface of the second insulating film pattern.

23. The method of fabricating the SOI substrate of claim 1, further comprising:
forming a second insulating film on the first insulating film with an opening that exposes at least a portion of the first single crystalline film;
forming a second non-single crystalline film on the exposed first single crystalline film and that at least partially fills the opening in the second insulating film; and
generating a second laser beam that heats the second non-single crystalline film to change the second non-single crystalline film into a second single crystalline film having the same single crystalline structure as the first single crystalline film in at least a major region of the second non-single crystalline film adjacent to the first single crystalline film in the opening in the first insulating film.

24. The method of fabricating the SOI substrate of claim 23, further comprising planarizing an upper surface of the first single crystalline film to make it aligned with an upper surface of the first insulating film before forming the second non-single crystalline film on the first single crystalline film.

25. The method of fabricating the SOI substrate of claim 24, wherein the upper surface of the first single crystalline film is planarized using chemical mechanical polishing (CMP).

26. The method of fabricating the SOI substrate of claim 24, wherein the upper surface of the first single crystalline film is planarized before generating the laser beam that heats the first non-single crystalline film to change the first non-single crystalline film into the first single crystalline film.

27. The method of fabricating the SOI substrate of claim 24, further comprising planarizing an upper surface of the second single crystalline film to make it aligned with an upper surface of the second insulating film.

28. The method of fabricating the SOI substrate of claim 1, further comprising:
forming the first insulating film pattern with a plurality of spaced apart openings exposing portions of the defined region of the semiconductor substrate;
forming the first single crystalline film in the plurality of openings in the first insulating film pattern, the first single crystalline film forming a first single crystalline film pattern;

forming a second insulating film pattern on the first insulating film pattern with a plurality of spaced apart openings each of which exposes a plurality of the first single crystalline film pattern in the plurality of openings in the first insulating film pattern;

forming a second non-single crystalline film on the exposed plurality of the first single crystalline film pattern and at least partially fills the plurality of openings in the second insulating film; and generating a second laser beam to heat the second non-single crystalline film and change the second non-single crystalline film in the plurality of openings in the second insulating film into a second single crystalline film having the same single crystalline structure as the first single crystalline film pattern.

29. The method of fabricating the SOI substrate of claim 28, further comprising:

forming a first mask covering the second single crystalline film pattern in first ones of the plurality of openings in the second insulating film while leaving exposed the second single crystalline film in second ones of the plurality of openings in the second insulating film;

doping first conductivity type impurities into the second single crystalline film in the second ones of the plurality of openings in the second insulating film while using the mask to block dopants from entering the second single crystalline film in the first ones of the plurality of openings in the second insulating film;

removing the first mask;

forming a second mask covering the second single crystalline film pattern in the second ones of the plurality of openings in the second insulating film while leaving exposed the second single crystalline film in the first ones of the plurality of openings in the second insulating film;

doping second conductivity type impurities, which are opposite to the first conductive type impurities, into the second single crystalline film in the first ones of the plurality of openings in the second insulating film while using the mask to block dopants from entering the second single crystalline film in the second ones of the plurality of openings in the second insulating film.

30. The method of fabricating the SOI substrate of claim 29, further comprising:

removing the second mask;

forming a third insulating film pattern on the second insulating film pattern with a plurality of spaced apart openings exposing portions of the second single crystalline film pattern;

forming a third non-single crystalline film on the exposed portions of the second single crystalline film pattern and filling the plurality of openings in the second insulating film;

generating a third laser beam to heat the third non-single crystalline film and change the third non-single crystalline film in the plurality of openings in the third insulating film into a third single crystalline film having the same single crystalline structure as the second single crystalline film pattern;

forming a fourth insulating film pattern on the third insulating film pattern with a plurality of spaced apart openings each of which exposes a plurality of the third single crystalline film in the plurality of openings in the third insulating film pattern;

forming a fourth non-single crystalline film on the exposed plurality of the third single crystalline film and at least partially filling the plurality of openings in the third insulating film; and generating a fourth laser beam to heat the fourth non-single crystalline film and change the force non-single crystalline film in the plurality of openings in the fourth insulating film into a force single crystalline film having the same single crystalline structure as the third single crystalline film pattern.

31. The method of fabricating the SOI substrate of claim 1, wherein:

the first insulating film is formed with a plurality of spaced apart openings that expose portions of the defined region of the semiconductor substrate having the single crystalline structure;

the first non-single crystalline film is formed on the first insulating film and exposed portions of the semiconductor substrate through the plurality of openings in the first insulating film; and the laser beam heats the first non-single crystalline film to change the first non-single crystalline film into the first single crystalline film in at least a major region of the first non-single crystalline film adjacent to the plurality of openings in the first insulating film.

32. The method of fabricating the SOI substrate of claim 31, further comprising:

planarizing an upper surface of the first single crystalline film to make it aligned with an upper surface of the first insulating film;

forming a second insulating film on the first insulating film with an opening that exposes the first single crystalline film in the plurality of openings in the first insulating film;

forming a second non-single crystalline film on the exposed first single crystalline film and filling the opening in the second insulating film;

generating a second laser beam that heats and changes the second non-single crystalline film into a second single crystalline film having the same single crystalline structure as the first single crystalline film;

planarizing an upper surface of the second single crystalline film to make it aligned with an upper surface of the second insulating film;

forming a third insulating film on the second insulating film with a plurality of spaced apart openings that expose portions of the second single crystalline film;

forming a third non-single crystalline film on the exposed second single crystalline film in the plurality of openings in the third insulating film;

generating a third laser beam that heats and changes the third non-single crystalline film into a third single crystalline film having the same single crystalline structure as the second single crystalline film;

planarizing an upper surface of the third single crystalline film to make it aligned with an upper surface of the third insulating film;

forming a fourth insulating film on the third insulating film with an opening that exposes the third single crystalline film in the plurality of openings in the third insulating film;

forming a fourth non-single crystalline film on the exposed third single crystalline film and that at least partially fills the opening in the fourth insulating film; and generating a fourth laser beam that heats and changes the fourth non-single crystalline film into a fourth single crystalline film having the same single crystalline structure as the third single crystalline film.

33. The method of fabricating the SOI substrate of claim 1, further comprising:

forming a second insulating film on the lower insulating film;

removing a portion of the second insulating film to form an opening exposing a portion of the first insulating film;

before forming the first non-single crystalline film, removing portions of the first insulating film, through the opening in the second insulating film, to form a plurality of spaced apart openings that expose portions of the defined region of the semiconductor substrate having the single crystalline structure;

forming the first non-single crystalline film on the exposed portion of the semiconductor substrate to fill the plurality of openings in the first insulating film and at least partially fill the opening in the second insulating film;

heating the first non-single crystalline film using the laser beam to change the first non-single crystalline film into the first single crystalline film planarizing an upper surface of the first single crystalline film to make it aligned with an upper surface of the second insulating film;

forming a third insulating film on the second insulating film;

forming a fourth insulating film on the third insulating film;

removing a portion of the fourth insulating film to form an opening exposing a portion of the third insulating film;

removing portions of the third insulating film, through the opening in the fourth insulating film, to form a plurality of spaced apart openings that expose portions of the first single crystalline film;

forming a second non-single crystalline film on the exposed portions of the first single crystalline film and to fill the plurality of openings in the third insulating film and at least partially fill the opening in the fourth insulating film; and generating a laser beam that heats the second non-single crystalline film to change the second non-single crystalline film into a second single crystalline film having the same single crystalline structure as the first single crystalline film.

\* \* \* \* \*